United States Patent
Fischer

(10) Patent No.: US 8,175,307 B2
(45) Date of Patent: May 8, 2012

(54) METHOD FOR ATTENUATING INTERFERING NOISE AND CORRESPONDING HEARING DEVICE

(75) Inventor: Eghart Fischer, Schwabach (DE)

(73) Assignee: Siemens Audiologische Technik GmbH, Erlangen (DE)

( * ) Notice: Subject to any disclaimer, the term of this patent is extended or adjusted under 35 U.S.C. 154(b) by 1092 days.

(21) Appl. No.: 11/991,830

(22) PCT Filed: Sep. 11, 2006

(86) PCT No.: PCT/EP2006/066247
§ 371 (c)(1),
(2), (4) Date: Mar. 11, 2008

(87) PCT Pub. No.: WO2007/031499
PCT Pub. Date: Mar. 22, 2007

(65) Prior Publication Data
US 2009/0154746 A1    Jun. 18, 2009

Related U.S. Application Data

(60) Provisional application No. 60/716,217, filed on Sep. 12, 2005.

(30) Foreign Application Priority Data

Sep. 12, 2005  (DE) .......................... 10 2005 043 314

(51) Int. Cl.
*H04R 25/00* (2006.01)

(52) U.S. Cl. ........................................ 381/317; 381/312

(58) Field of Classification Search .................. 381/71.1, 381/93, 94.1–94.9, 312–313, 316–318, 320
See application file for complete search history.

(56) References Cited

U.S. PATENT DOCUMENTS

| | | |
|---|---|---|
| 3,458,669 A | 7/1969 | Lafon et al. |
| 4,827,458 A | 5/1989 | D'Alayer de Costemore D'Arc |
| 5,884,260 A | 3/1999 | Leonhard |
| 6,600,955 B1 | 7/2003 | Zierhofer |
| 6,757,395 B1 | 6/2004 | Fang et al. |
| 8,014,549 B2 * | 9/2011 | Kates ............................ 381/316 |
| 2003/0081804 A1 * | 5/2003 | Kates ............................ 381/316 |
| 2005/0111683 A1 * | 5/2005 | Chabries et al. ............... 381/317 |
| 2006/0227986 A1 * | 10/2006 | Swanson et al. ............... 381/312 |

FOREIGN PATENT DOCUMENTS

| | | |
|---|---|---|
| DE | 3733983 A1 | 4/1989 |
| DE | 69417445 T2 | 10/1996 |
| DE | 60010273 T2 | 4/2005 |
| EP | 0290415 A1 | 11/1988 |
| WO | WO 8302862 A1 | 8/1983 |
| WO | WO 0152242 A1 | 7/2001 |

* cited by examiner

*Primary Examiner* — Suhan Ni

(57) ABSTRACT

Transient interfering sounds are to have a less disturbing effect in hearing devices. For this purpose, it is provided that an envelope curve of an input signal of a hearing device, particularly of a hearing aid, is detected. The slope and/or the height of edges of the envelope curve is continuously determined. The output signal of the hearing device is then attenuated in dependence on the slope and/or height of the respective edge determined. Transient sounds of high level are thus transmitted only in an attenuated manner by the hearing device.

20 Claims, 3 Drawing Sheets

METHOD FOR ATTENUATING INTERFERING NOISE AND CORRESPONDING HEARING DEVICE

CROSS REFERENCE TO RELATED APPLICATIONS

This application is the US National Stage of International Application No. PCT/EP2006/066247, filed Sep. 11, 2006 and claims the benefit thereof. The International Application claims the benefits of German application No. 10 2005 043 314.6 DE filed Sep. 12, 2005 and provisional patent application 60/716,217 filed on Sep. 12, 2005, all of the applications are incorporated by reference herein in their entirety

FIELD OF INVENTION

The present invention relates to a method for attenuating interfering noise in a hearing device, particularly in a hearing aid. In addition, the present invention relates to a corresponding hearing device.

BACKGROUND OF INVENTION

Wearers of hearing aids have a large problem in that transient interfering sounds which are of only short duration such as, for example, clattering of dishes, crackling paper and the like, are amplified to a comparatively high level. These transient interfering sounds are in most cases felt to be excessively loud and very disturbing, therefore.

At present, no hearing aids are available on the market which have an algorithm which especially counters such transient interfering sounds. The reasons for this are that in the application of hearing aids, the transient interfering sound must be attenuated extremely quickly and strongly. In addition, the attenuation must be implemented in real time, i.e. without the output signal being noticeably delayed. As a rule, however, this is associated with audible artifacts since the speed of regulation falls into the range below single periods of the time signal of, e.g., the voice.

Transient interfering sounds are attenuated only inadequately by hearing aids with AGC (Automatic Gain Control). With AGC, rapid input-level-dependent control is implemented but the higher the level, the more this control intervenes in the signal. However, this is not practicable for a short signal such as transient interfering sounds.

From the printed document DE 37 33 983 A1, a method for attenuating interfering noise in sound signals transmitted by hearing aids is known. In this arrangement, spectral distributions of the signals are obtained by a Fourier analysis. The respective spectral distribution is divided into different frequency windows via filters. Following that, the change in the spectral distribution with time in the respective frequency window is determined. Thus, the envelope curve of the spectral distributions is monitored over time for the individual frequency windows. Depending on control signals in the individual frequency windows, the amplitudes of the interfering signals are lowered in the respective spectral distribution. The spectral distribution thus "cleaned up" is transformed back into the time domain.

In addition, a method for detecting and generating transient conditions in sound signals is described in printed document DE 694 17 445 T2. To extract information from the form of the energy changes, the forms of the energy changes are represented by the form of a transient pulse of the signal. An envelope curve detection is preferably used. Furthermore, slope and/or change in slope of a part of the front edge is registered.

Printed document DE 600 10 273 T2 also discloses a multichannel cochlear implant with neural response telemetry. In this arrangement, the envelope curve of an input signal is detected in the cochlear implant.

Furthermore, a method and a device for the reduction of interfering noise are known from printed document WO 01/52242 A1. In this device, the ratio of a signal envelope curve to a noise envelope curve is used for adjusting an amplifier function.

The U.S. Pat. No. 3,458,669 discloses devices for studying or treating acustic phenomena. Such devices or hearing aids serve to replace defective portions of an ear. The devices are arranged in such manner as to detect the importance of the sound impulses contained in these phenomena, in particular in order to determine—and possibly to reduce—the degree of noxiousness of said impulses for the ears of the hearers or again to set up electric terms representative of the acoustic sensations truly perceived by the hearers of said phenomena. For this purpose, the device includes a system for differentiating signals, means for collecting other portions of the signals before their differentiation and for sending said other portions to an earphone capable of transforming it into sounds and means capable of preventing the transfer of the other portion of said earphone at the times when the amplitude of the corresponding differentiated signals exceeds a predetermined threshold.

The further document EP 0 290 415 A1 discloses a sound surge detector for a alerting headphone users. For appliancies or devices transmitting data originating from a sound source and directed at headphones, the warning method provides for a pick-up of external ambient signals followed by their processing in order to generate a control signal when an emergence of given minimum characteristics is detected. The signal provides for activation of a warning signal and its transmission to the headphones.

A method for damping transient sounds, preferably in hearing aids is described in document WO 83/02862 whereby the derivative of the incoming sound signal is calculated. The transient eliminator is adapted to discriminate transient sounds in a complex sound signal and thereafter to selectively eliminate the same. The method is attained in that the main derivative of the sound signal controls the damping of uncomfortable transients occurring in the audio signal. It is thus the object of the present invention to propose a method which allows transient interfering sounds to be perceived as less disturbing. In addition, a corresponding hearing device is to be specified.

SUMMARY OF INVENTION

According to the invention, this object is achieved by a method for attenuating interfering sound in a hearing device, in particular in a hearing aid, by detecting an envelope curve of an input signal, determining the slope and height of an edge of the envelope curve and attenuating the output signal of the hearing device in dependence on the slope and height of the edge determined. The level of the output signal is only lowered in the immediate vicinity of the next zero transitions of the input signal. In this manner, discontinuities can be avoided which lead to an audible "click".

As an alternative or in addition to lowering the level in the vicinity of the next zero transition, the attenuating is limited in dependence on the instantaneous or mean level of the output signal of the hearing device. As a result, too much regulation can be avoided in which the amplitude of the lowering to be performed is overestimated.

In addition, according to the invention, a hearing device is provided, particularly a hearing aid, with a detecting device for detecting an envelope curve of an input signal, a data processing device for determining the slope and height of the edge of the envelope curve and an attenuating device for attenuating the output signal of the hearing device in dependence on the slope and height of the edge determined by the data processing device. Here, too, the level of the output signal is only lowered in the immediate vicinity of a zero transition of the input signal and/or the attenuating in dependence on the instantaneous or mean level of the output signal.

It is thus advantageously possible to attenuate individual transient interfering sounds very concretely. Using the envelope curve, these transient interfering sounds can be reliably detected and correspondingly selectively attenuated. The present invention is delimited with respect to an AGC in as much as it is not the result of a level measurement which is evaluated but that initially the mere occurrence of an envelope curve edge which rises steeply enough (and can thus be measured virtually without delay) is sufficient by itself in order to trigger the process of lowering the input signal.

A further difference from an AGC consists in that the signal level occurring after the occurrence of the edge is irrelevant since there should no longer be any attenuation at this time (namely after the edge) whereas in the case of an AGC, loud levels are usually mapped onto quieter ones ("dynamic range compression") via a level input/output characteristic.

The steeper and/or higher the edge, the more the output signal is preferably attenuated. It has been found that very steep and high edges are felt to be unpleasant so that it is advantageous to attenuate these more, the steeper and the higher they are.

In addition to the steepness and height of the edge, a mean basic level of the input signal can be detected so that the output signal can also be attenuated in dependence on the basic level. It is advantageous in this context that the higher this basic level, the less the output signal is attenuated. This makes it possible to prevent the basic level from being lowered severely over a short time when a transient interfering sound occurs.

The attenuation of the interfering noise according to the invention can be performed separately in different frequency bands by means of the respective envelope curves.

BRIEF DESCRIPTION OF THE DRAWINGS

The present invention will now be explained in greater detail with reference to the attached drawings, in which.

DETAILED DESCRIPTION OF INVENTION

Figure 7:
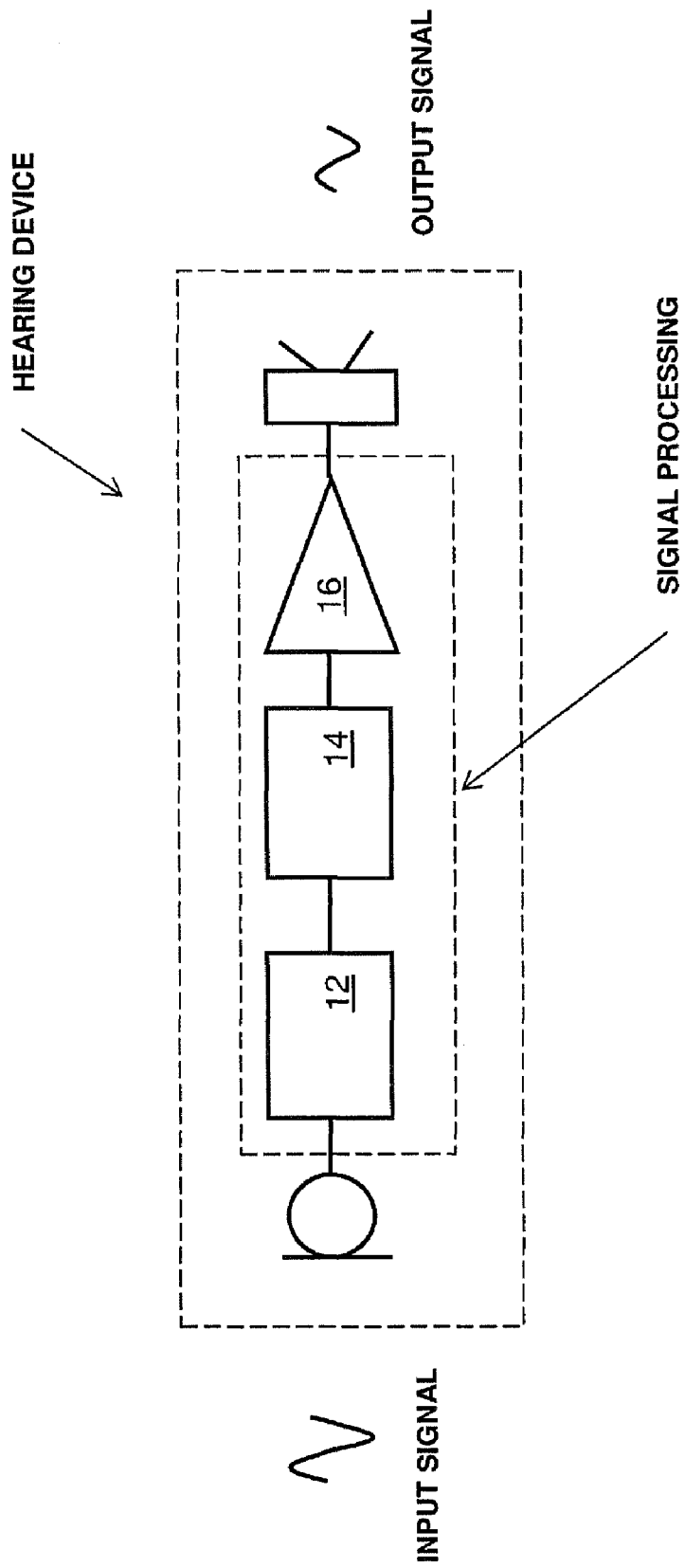
FIG. 7 shows a block diagram of a hearing device of an embodiment of the invention.

The exemplary embodiment described in greater detail in the text which follows represents a preferred embodiment of the present invention. A hearing device of an embodiment of the invention is illustrated in FIG. 7, particularly a hearing aid, with a detecting device 12 for detecting an envelope curve of an input signal, a data processing device 14 for determining the slope and height of the edge of the envelope curve and an attenuating device 16 for attenuating the output signal of the hearing device in dependence on the slope and height of the edge determined by the data processing device.

Figure 1:
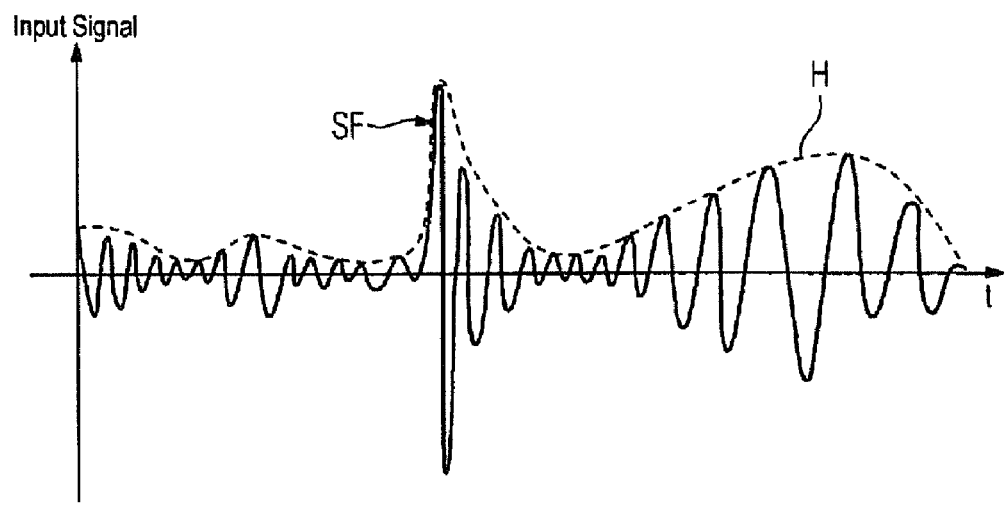
FIG. 1 shows the variation of a first input signal with time.

In a hearing aid, the input signal represented in FIG. 1 is registered in accordance with FIG. 1. For this input signal, the envelope curve H is determined by a corresponding envelope curve detector. The variation of the envelope curve H of the input signal is continuously analyzed with regard to slope and height of rising edges. As soon as the envelope curve H exceeds a certain slope, it cannot belong to a voice signal since voice signals usually do not contain any edges which rise extremely steeply.

FIG. 1 shows such a steep edge SF, the slope of which exceeds a predetermined threshold value. If this transgression is registered during the continuing analysis, the height of this edge is also determined.

Figure 2:
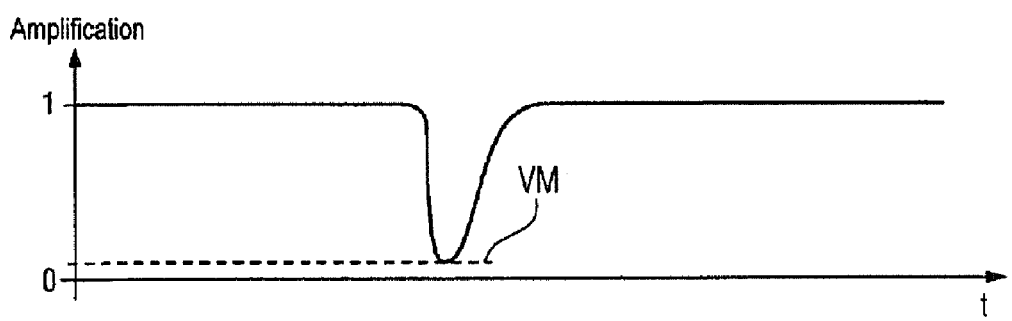
FIG. 2 shows the amplification with respect to the input signal of FIG. 1.

Triggered by the steep edge SF, the amplification of the signal is reduced according to FIG. 2. In other words, the signal following the steep edge is correspondingly attenuated. The steeper and higher the edge, the greater the attenuation. On the other hand, the higher the instantaneous basic level without noise pulse of the signal, the less will be the attenuation. This is because generally a transient noise pulse is less disturbing with a high basic level. In the present case, the basic level is relatively low so that the attenuation following the steep edge is relatively high. From the maximum attenuation, the minimum amplification VM reproduced in FIG. 2 is obtained which leads to the output signal essentially having the level or long-time level averaged over a relatively long period at the time of interference.

Figure 3:
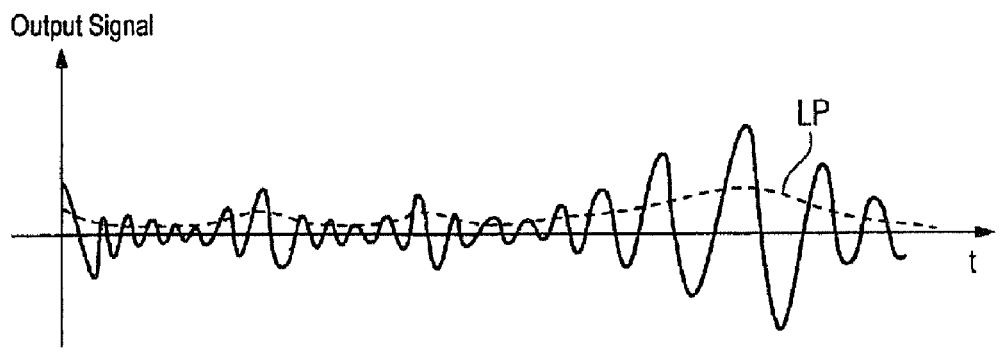
FIG. 3 shows the output signal with respect to the signal variations of FIG. 1 and FIG. 2.

From the input signal according to FIG. 1 and the amplification according to FIG. 2, the output signal shown in FIG. 3 is obtained. It can be seen that at the time of the steep edge SF of the input signal, no such edge occurs in the output signal but that the level is essentially kept at the level of the long-time level LP there.

Figure 4:
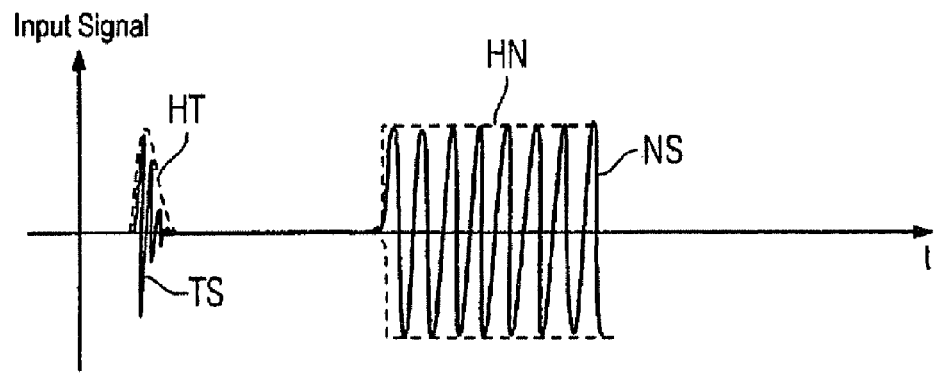
FIG. 4 shows the variation of a second input signal with time.
Figure 5:
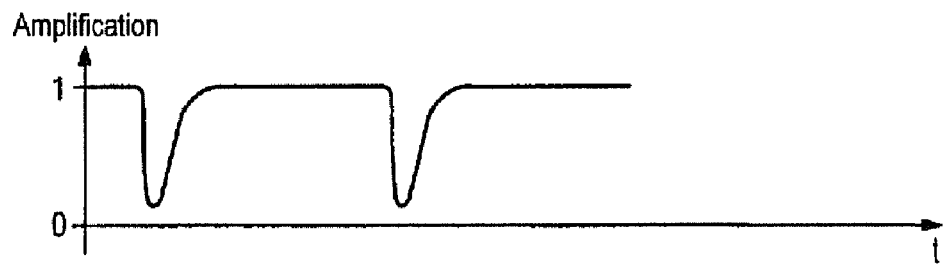
FIG. 5 shows an amplification belonging to the input signal of FIG. 4.

In FIG. 4, a further input signal is shown which essentially consists of a short transient interfering sound TS and a useful signal NS having the same maximum level. The respective envelope curves HT and HN are drawn dashed for both sound components. The useful signal NS essentially has the same steep edge as the transient signal TS. For this reason, a corresponding attenuation as shown in FIG. 5 occurs at both signals at the time of the occurrence of the steep edge. The attenuation caused by the edge is only of short duration as also in FIG. 2.

Figure 6:
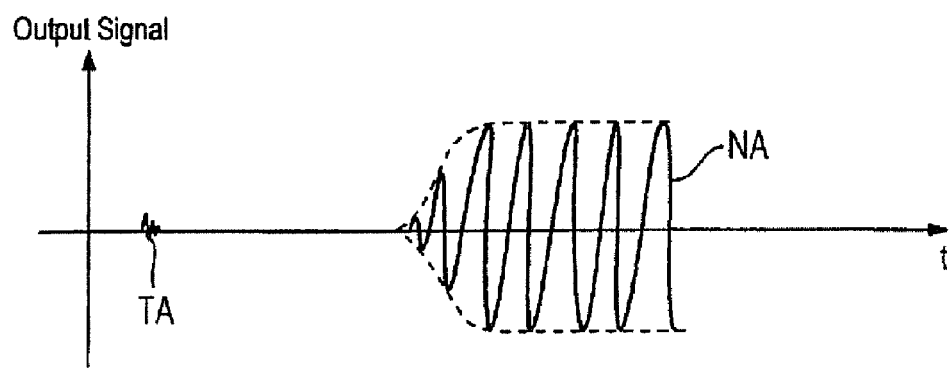
FIG. 6 shows the output signal with respect to the signal variations of FIG. 4 and FIG. 5.

In FIG. 6, the resultant output signal is again shown. The attenuation of the transient interfering sound TS leads to a transient output signal TA of low level being produced. At the sudden occurrence of the signal NS, the beginning is greatly attenuated and there is no further attenuation after a short time so that the useful output signal NA shown in FIG. 6 is produced. However, the output signal which was briefly attenuated at the start does not have a disturbing effect for the wearer of the hearing aid.

In the regulation or control of the output signal level presented, two problems can occur: a regulation which is too fast and one which is too strong. Too fast a regulation becomes noticeable especially whenever a signal, which also contains low-frequency components, is lowered, for example due to a high-frequency transient noise pulse. This can lead to a lowering occurring within a few samples precisely at a maximum of the sinusoidal low-frequency oscillation. The consequence would be a discontinuity ("jump") in the signal variation which would be audible as a "click". This problem can be diffused by permitting a lowering only in the vicinity of the next zero transitions of the signal occurring. The entire lowering can occur in a number of steps in each case at a zero transition. Instead of a large jump at the point of a signal peak, this results in a number of kinks in the signal form in the vicinity of the subsequent zero transitions which are essentially less audible.

In addition, too much regulation can lead to the following problems: since the level must be lowered extremely quickly, the amount of lowering must initially be estimated in advance. This can lead to the amount of lowering being overestimated. The consequence would be so-called "holes" in the envelope curve of the signal which are produced as a result of too much lowering over too long a time.

This problem can be solved in that the attenuation to be applied is limited to the output signal in dependence on the instantaneous level of the output signal. This means that a minimum amplification level VM remains as shown in FIG. 2. The output signal is thus attenuated only to the extent that its value does not drop below a level which corresponds to a mean over a comparatively long measuring time.

The invention claimed is:

1. A method for attenuating interfering noise in a hearing device, comprising:
 processing an input signal received by a hearing device into an output signal by:
  detecting an envelope curve of the input signal;
  determining via a data processing device a slope and a height of an edge of the envelope curve; and
  attenuating the input signal of the hearing device based on the determined slope and height,
  wherein the level of the resulting attenuated output signal is only lowered in the immediate vicinity of a next zero transition of the input signal.

2. The method as claimed in claim 1, wherein the resulting attenuation of the output signal is related to the steepness and height of the edge such that a greater attenuation occurs when the edge is steeper and/or higher.

3. The method as claimed in claim 1, wherein the resulting attenuation of the output signal is related to the steepness or height of the edge such that a greater attenuation occurs when the edge is steeper and/or higher.

4. The method as claimed in claim 1, further comprises detecting a mean basic level of the input signal, wherein the resulting attenuation of the output signal is related to the mean basic level such that a lower attenuation occurs when the mean basic level is higher.

5. The method as claimed in claim 1, wherein the method is performed separately in a number of frequency bands.

6. A method for attenuating interfering noise in a hearing device, comprising:
 processing an input signal received by a hearing device into an output signal by:
  detecting an envelope curve of the input signal;
  determining via a data processing device a slope and a height of an edge of the envelope curve; and
  attenuating the input signal into an output signal of the hearing device based on the determined slope and height,
  wherein the attenuating is limited based on an instantaneous or mean level of the output signal of the hearing device.

7. The method as claimed in claim 6, wherein the resulting attenuation of the output signal is related to the steepness and height of the edge such that a greater attenuation occurs when the edge is steeper and/or higher.

8. The method as claimed in claim 6, wherein the resulting attenuation of the output signal is related to the steepness or height of the edge such that a greater attenuation occurs when the edge is steeper and/or higher.

9. The method as claimed in claim 6, further comprises detecting a mean basic level of the input signal, wherein the attenuation of the output signal is related to the mean basic level such that a lower attenuation occurs when the mean basic level is higher.

10. The method as claimed in claim 6, wherein the method is performed separately in a number of frequency bands.

11. A hearing device adapted to receive an input signal and process the input signal into an output signal, the hearing device comprising:
 a detecting device that detects an envelope curve of the input signal;
 a data processing device that determines a slope and a height of an edge of the envelope curve; and
 an attenuating device that attenuates the input signal into an output signal of the hearing device based on the determined slope and height,
 wherein a level of the resulting attenuated output signal is only lowered in the immediate vicinity of a next zero transition of the input signal.

12. The hearing device as claimed in claim 11, wherein the resulting attenuation of the output signal is related to the steepness and height of the edge such that a greater attenuation occurs when the edge is steeper and/or higher.

13. The hearing device as claimed in claim 11, wherein the resulting attenuation of the output signal is related to the steepness or height of the edge such that a greater attenuation occurs when the edge is steeper and/or higher.

14. The hearing device as claimed in claim 11, further comprises detecting a mean basic level of the input signal, wherein the attenuation of the output signal is related to the mean basic level such that a lower attenuation occurs when the mean basic level is higher.

15. The hearing device as claimed in claim 11, wherein the slope and the height is determined on a plurality of frequency bands and a corresponding attenuation is performed on each frequency band.

16. A hearing device adapted to receive an input signal and process the input signal into an output signal, the hearing device comprising:
 a detecting device that detects an envelope curve of the input signal;
 a data processing device that determines a slope and a height of an edge of the envelope curve; and
 an attenuating device that attenuates the input signal into an output signal of the hearing device based on the determined slope and height,
 wherein the attenuating is limited based on an instantaneous or mean level of the output signal of the hearing device.

17. The hearing device as claimed in claim 16, wherein the resulting attenuation of the output signal is related to the steepness or height of the edge such that a greater attenuation occurs when the edge is steeper and/or higher.

18. The hearing device as claimed in claim 16, wherein the resulting attenuation of the output signal is related to the steepness and height of the edge such that a greater attenuation occurs when the edge is steeper and/or higher.

19. The hearing device as claimed in claim 16, further comprises detecting a mean basic level of the input signal, wherein the resulting attenuation of the output signal is related to the mean basic level such that a lower attenuation occurs when the mean basic level is higher.

20. The hearing device as claimed in claim 16, wherein the slope and the height is determined on a plurality of frequency bands and a corresponding attenuation is performed on each frequency band.

* * * * *